United States Patent
Matsuzaki (10) Patent No.: US 11,956,902 B2
(45) Date of Patent: Apr. 9, 2024

(54) SOLDER RECOVERY DEVICE

(71) Applicant: FUJI CORPORATION, Chiryu (JP)

(72) Inventor: Naoki Matsuzaki, Nishio (JP)

(73) Assignee: FUJI CORPORATION, Chiryu (JP)

(*) Notice: Subject to any disclaimer, the term of this patent is extended or adjusted under 35 U.S.C. 154(b) by 0 days.

(21) Appl. No.: 17/996,462

(22) PCT Filed: Apr. 25, 2020

(86) PCT No.: PCT/JP2020/017870
§ 371 (c)(1),
(2) Date: Oct. 18, 2022

(87) PCT Pub. No.: WO2021/215017
PCT Pub. Date: Oct. 28, 2021

(65) Prior Publication Data
US 2023/0225059 A1 Jul. 13, 2023

(51) Int. Cl.
*B41F 15/44* (2006.01)
*B41F 31/20* (2006.01)
*H05K 3/12* (2006.01)
*H05K 3/34* (2006.01)

(52) U.S. Cl.
CPC .......... *H05K 3/1216* (2013.01); *B41F 15/44* (2013.01); *B41F 31/20* (2013.01); *H05K 3/34* (2013.01); *H05K 2203/04* (2013.01)

(58) Field of Classification Search
None
See application file for complete search history.

(56) References Cited

U.S. PATENT DOCUMENTS

2019/0337287 A1* 11/2019 Fukakusa ............... B41F 15/08

FOREIGN PATENT DOCUMENTS

| JP | H05-24175 A | * | 2/1993 |
| JP | 6-316056 A | | 11/1994 |
| JP | 2006062209 A | * | 3/2006 |
| JP | 2017-71072 A | | 4/2017 |
| JP | 2017-164948 A | | 9/2017 |
| WO | WO 2018/096607 A1 | | 5/2018 |

OTHER PUBLICATIONS

International Search Report dated Jun. 16, 2020 in PCT/JP2020/017870 filed on Apr. 25, 2020.

* cited by examiner

*Primary Examiner* — Leslie J Evanisko
(74) *Attorney, Agent, or Firm* — Oblon, McClelland, Maier & Neustadt, L.L.P.

(57) ABSTRACT

A solder recovery device includes a recovery plate, a lifting and lowering device, and multiple connecting sections. The recovery plate recovers solder. The lifting and lowering device lifts up and lowers the recovery plate. The multiple connecting sections include a fixing portion provided on the recovery plate and configured to detachably attach the recovery plate to the lifting and lowering device and a fixed portion provided on the lifting and lowering device and to which the fixing portion is fixed, and are configured to restrain the recovery plate from moving in a predetermined direction relative to the lifting and lowering device when the fixing portion is fixed to the fixed portion. The multiple connecting sections have different restraining directions in which the recovery plate is restrained from moving relative to the lifting and lowering device.

12 Claims, 4 Drawing Sheets

SOLDER RECOVERY DEVICE

TECHNICAL FIELD

The present description discloses a technology regarding a solder recovery device.

BACKGROUND ART

A screen printer described in Patent Literature 1 includes a main body frame, a squeegee, a recovery member, and a driving section. The squeegee is configured to print a viscous fluid on a mask placed on the main body frame on a board and can move in a first direction directed from a first end towards a second end of the mask. The recovery member can move in the first direction to recover the viscous fluid moved by the squeegee. The driving section moves the squeegee and the recovery member.

PATENT LITERATURE

Patent Literature 1: WO 2018/096607

BRIEF SUMMARY

Technical Problem

A recovery plate for recovering solder, for example, needs to be removed for cleaning and is attached detachably to a lifting and lowering device for lifting up and lowering the recovery plate. For example, in the case that the recovery plate is fixed to the lifting and lowering device with a knurled screw or the like, there is a possibility that the knurled screw is loosened by vibration generated when the recovery plate is lifted up or lowered, or the like. In addition, the tightening force with which an operator tightens the knurled screw varies, resulting in a possibility that the recovery plate cannot be fixed to the lifting and lowering device sufficiently.

In view of these situations, the present description discloses a solder recovery device which can strengthen fixation of a recovery plate configured to recover solder to a lifting and lowering device configured to lift up and lower the recovery plate.

Solution to Problem

The present description discloses a solder recovery device including a recovery plate, a lifting and lowering device, and multiple connecting sections. The recovery plate recovers solder. The lifting and lowering device lifts up and lowers the recovery plate. The multiple connecting sections include a fixing portion provided on the recovery plate and configured to detachably attach the recovery plate to the lifting and lowering device and a fixed portion provided on the lifting and lowering device and to which the fixing portion is fixed, whereby when the fixing portion is fixed to the fixed portion, the multiple connecting sections restrain the recovery plate from moving in a predetermined direction relative to the lifting and lowering device. The multiple connecting sections have different restraining directions in which the recovery plate is restrained from moving relative to the lifting and lowering device.

Advantageous Effects

The solder recovery device described above includes the multiple connecting sections having the different restraining directions in which the recovery plate is restrained from moving relative to the lifting and lowering deice when the fixing portion is fixed to the fixed portion. Accordingly, with the solder recovery device, even if restraint in a first direction is released, the recovery plate can be restrained from moving in a second direction relative to the lifting and lowering device. That is, with the solder recovery device, the fixing of the recovery plate to the lifting and lowering device can be strengthened more than with a solder recovery device including one connecting section having one restraining direction.

DESCRIPTION OF EMBODIMENTS

1. Embodiment

1-1. Configuration Example of Printer WM1

Printer WM1 prints solder SP0 in multiple component mounting positions on board CB0. Printer WM1 of the present embodiment executes a printing process in which squeegee 34 slides on mask MK0 so as to print solder SP0 on board CB0 through opening portion H0 in relevant mask MK0O.

Figure 1:
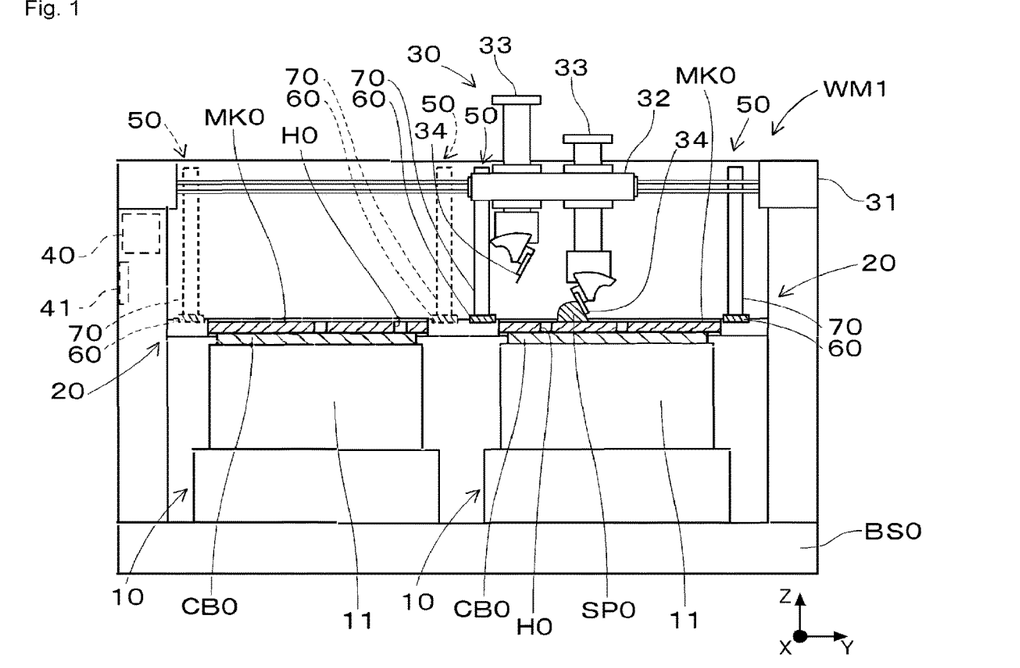
FIG. 1 illustrates a partially sectional view showing a configuration example of a printer.

As illustrated in FIG. 1, printer WM1 of the present embodiment includes two board conveyance devices 10, 10, two mask supporting devices 20, 20, squeegee moving device 30, control device 40, and two solder recovery devices 50, 50. In the present description, a conveyance direction of board CB0 (a direction perpendicular to a surface of a sheet of paper on which FIG. 1 is drawn) is referred to as an X-direction, a front-rear direction of printer WM1 orthogonal to the X-direction (a left-right direction on the surface of the sheet of paper on which FIG. 1 is drawn), which is a printing direction, is referred to as a Y-direction, and a vertical direction orthogonal to the X-direction and the Y-direction (an up-down direction on the surface of the sheet of paper on which FIG. 1 is drawn) is referred to as a Z direction.

Each of two board conveyance devices 10, 10 conveys board CB0, which is a printing target. Board CB0 is a circuit board, on which an electronic circuit, an electrical circuit, a magnetic circuit, and the like are formed. Two board conveyance devices 10, 10 are provided on base BS0 of printer WM1. Each of two board conveyance devices 10, 10 conveys board CB0 by, for example, a belt conveyor extending in the conveyance direction (the X-direction) of board CB0.

Each of two board conveyance devices 10, 10 includes board holding section 11 configured to hold board CB0 which is conveyed into Printer WM1. Board holding section 11 is provided below mask MK0, and is configured to be lifted up and lowered in a vertical direction (the Z-direction) by a linear motion mechanism such as a feeding screw mechanism, for example. Specifically, board holding section 11 is lowered while board CB0 is being conveyed in, and when board CB0 is conveyed in and placed in a predetermined position, board holding section 11 is lifted up together with board CB0 and then holds board CB0 in such a state that an upper surface of board CB0 is in close contact with a lower surface of mask MK0.

Each of two mask supporting devices 20, 20 is provided above board conveyance device 10. Mask supporting device 20 supports mask MK0 by a pair of support bases. The pair of support bases are disposed individually on a left-hand side (a farther side on the surface of the piece of paper on which FIG. 1 is drawn) and a right-hand side (a nearer side on the surface of the piece of pater on which FIG. 1 is drawn, which is not shown in FIG. 1) of printer WM1 when printer WM1 is viewed from a front thereof, and are each formed in such a manner as to extend along the printing direction (the Y direction).

FIG. 1 is a partially sectional view of printer WM1 taken along the printing direction (the Y-direction) thereof, schematically showing an inside portion of printer WM1, as well as sections of mask MK0 and board CB0 as viewed from a side of printer WM1. Opening portions H0 are formed in mask MK0 in such a manner as to penetrate therethrough in predetermined positions corresponding to predetermined positions on a wiring pattern on board CB0. Mask MK0 is supported by mask supporting device 20, for example, via a frame member provided on an outer circumferential edge thereof.

Squeegee moving device 30 lifts up and lowers squeegee 34 in the vertical direction (the Z-direction) perpendicular to mask MK0 and moves squeegee 34 in the printing direction (the Y-direction) on an upper surface of mask MK0. Squeegee moving device 30 includes head driving device 31, squeegee head 32, pair of squeegee lifting and lowering devices 33, 33, and pair of squeegees 34, 34. Head driving device 31 is disposed on an upper side of printer WM1. Head driving device 31 can move squeegee head 32 in the printing direction (the Y-direction) by, for example, a linear motion mechanism such as a feeding screw mechanism.

Squeegee head 32 is clamped by and fixed to a moving body making up the linear motion mechanism of head driving device 31. Squeegee head 32 holds pair of squeegee lifting and lowering devices 33, 33. Pair of squeegee lifting and lowering devices 33, 33 can hold individually corresponding squeegee 34 and be driven independently of each other. Pair of squeegee lifting and lowering device devices 33, 33 each lift up and lower corresponding squeegee 34 that is held thereby by driving an actuator such as an air cylinder.

Squeegee 34 slides on the upper surface of mask MK0 to move solder SP0 supplied to the upper surface of mask MK0 along mask MK0. Cream solder (solder paste) can be used for solder SP0. Solder SP0 is printed on board CB0 disposed on a lower surface side of mask MK0 as a result of solder SP0 being applied to board CB0 via opening portions H0 in mask MK0. In the present embodiment, pair of squeegees 34, 34 are each a plate-like member which is formed in such a manner as to extend along the conveyance direction (the X-direction) of board CB0 which is orthogonal to the printing direction (the Y-direction).

Of pair of squeegees 34, 34, front (left in FIG. 1) squeegee 34 is used for a printing process of moving solder SP0 from a front side to a rear side, and a direction from a front side to a rear side of printer WM1 is referred to as an advancing direction. Of pair of squeegees 34, 34, rear (right in FIG. 1) squeegee 34 is used for a printing process of moving solder SP0 from the rear side to the front side, and a direction from the rear side to the front side of printer WM1 is referred to as an advancing direction. In either of squeegees 34, a direction opposite to the advancing direction is referred to as a retreating direction.

Pair of squeegees 34, 34 are each held to corresponding squeegee lifting and lowering device 33 in such a manner that a front surface portion positioned on an advancing side is directed downwards. In other words, pair of squeegees 34, 34 are each held to corresponding squeegee lifting and lowering device 33 in such a manner that a rear surface portion positioned on a retreating side is directed upwards. An inclination angle of each of pair of squeegees 34, 34 is adjusted by an adjustment mechanism provided at a lower portion of corresponding squeegee lifting and lowering device 33.

Control device 40 includes an arithmetic unit and a storage device, which are well known, and a control circuit is configured therein. Control device 40 is connected to a management device in such a manner as to communicate therewith and can send and receive various data between the management device and itself. Control device 40 can drive and control two board conveyance devices 10, 10, two mask supporting devices 20, 20, squeegee moving device 30, and two solder recovery devices 50, 50 based on a production program, detection results of various types of sensors, and the like.

Display device 41 is provided on control device 40. Display device 41 can display the operation status of printer WM1. In addition, in the present embodiment, display device 41 is made up of a touch panel and also functions as an input device for receiving various operations by an operator.

Control device 40 acquires various pieces of information stored in the storage device and the detection results of the various types of sensors provided on printer WM1. The storage device stores a production program for driving printer WM1 and the like. Control device 40 drives and controls, for example, squeegee moving device 30. Control device 40 sends out a control signal to squeegee moving device 30 based on the various pieces of information, the detection results, and the like which are described above. As a result, positions in the printing direction (the Y-direction) and positions (heights) in the vertical direction (the Z-direction), as well as movement speeds and inclination angles of pair of squeegees 34, 34 which are held to squeegee head 32 are controlled. Then, as described above, pair of squeegees 34, 34 are driven and controlled to print solder SP0 on board CB0 disposed on the lower surface side of mask MK0.

1-2. Solder Recovery Device 50

1-2-1. Outline of Solder Recovery Device 50

Figure 2:
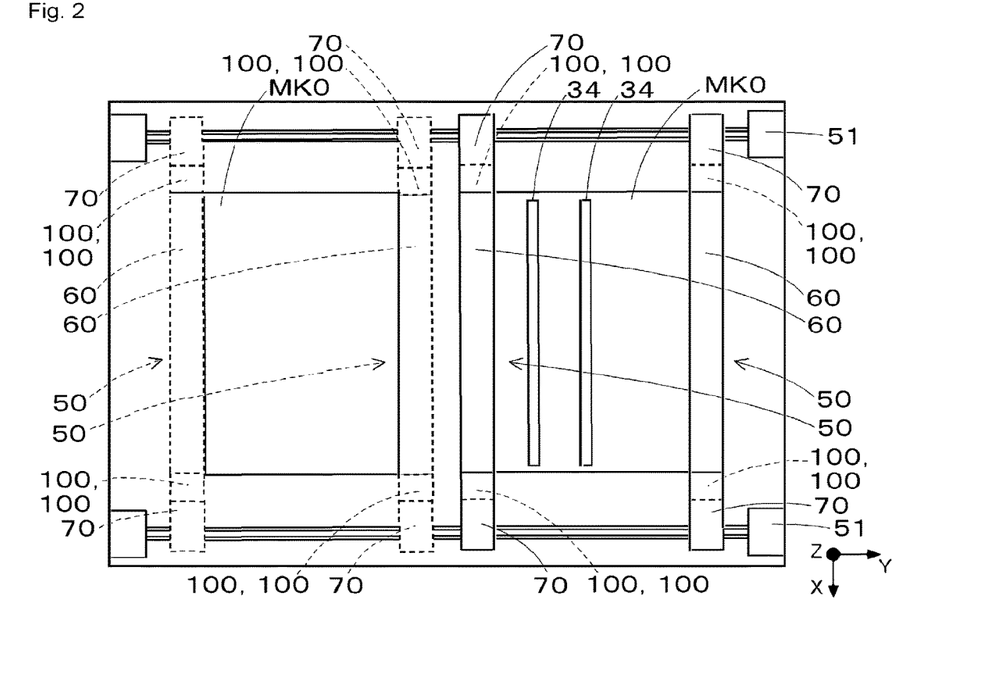
FIG. 2 illustrates a plan view showing an arrangement example of solder recovery devices of the printer shown in FIG. 1.
Figure 3:
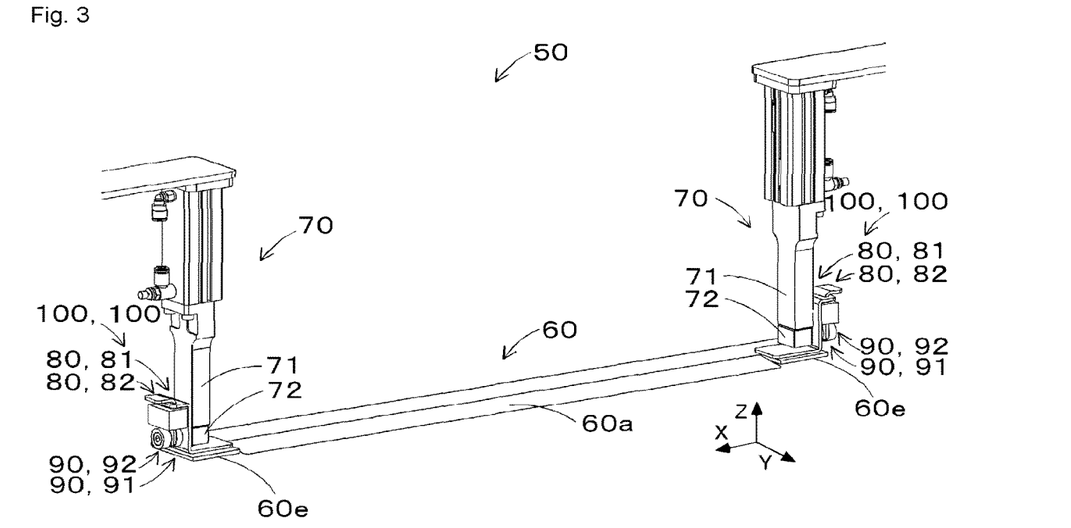
FIG. 3 illustrates a perspective view showing a configuration example of the solder recovery device.

As shown in FIGS. 1 and 2, two solder recovery devices 50 and 50 are provided at both end portions in the printing direction (Y-direction) of mask MK0. As shown in FIG. 3, two solder recovery devices 50, 50 each include a recovery plate 60, at least one (two in FIG. 3) lifting and lowering device 70, 70, and multiple (two in FIG. 3) connecting sections 100, 100 for one lifting and lowering device 70. Each of multiple (two) connecting sections 100 (a total of four connecting sections 100) includes fixing portion 80 and fixed portion 90.

Two solder recovery devices 50, 50, which are indicated by solid lines in FIGS. 1 and 2, are provided at both end portions in the printing direction (Y-direction) of mask MK0 on the rear side (the right-hand side in FIGS. 1 and 2) of printer WM1. As shown in FIG. 1, rear (right in FIG. 1) squeegee 34 of printer WM1 moves solder SP0 from the rear side toward the front side. As a result, solder SP0 is placed on recovery plate 60 of rear (right in FIGS. 1 and 2) solder recovery device 50, indicated by the solid lines, of printer WM1 before squeegee 34 starts moving.

When relevant squeegee 34 moves in the advancing direction (from the rear side towards the front side of printer WM1) from the state described above, solder SP0 moves on mask MK0, whereby a printing process is executed. When the printing process ends, relevant solder SP0 is moved to recovery plate 60 of front (left in FIGS. 1 and 2) solder recovery device 50, indicated by the solid lines, of printer WM1 by squeegee 34.

As shown in FIG. 2, printer WM1 includes pair of driving devices 51, 51. Pair of driving devices 51, 51 can cause two solder recovery devices 50, 50 to move (slide) in the printing direction (Y direction) by, for example, a linear motion mechanism such as a feeding screw mechanism while holding a positional relationship between two solder recovery devices 50, 50 as it is. Two solder recovery devices 50, 50 indicated by dashed lines in FIGS. 1 and 2 show a state in which two solder recovery devices 50, 50 indicated by the solid lines are moved to both end portions in the printing direction (Y-direction) of mask MK0 on the front side (the left-hand side in FIGS. 1 and 2) of printer WM1 by pair of corresponding driving devices 51, 51.

Two solder recovery devices 50, 50 each includes two lifting and lowering device 70, 70, as shown in FIG. 3. Two lifting and lowering devices 70, 70 lift up recovery plate 60 to a state shown in FIG. 3 before pair of driving devices 51, 51 cause two solder recovery devices 50, 50 to move (slide) in the printing direction (Y-direction). When two solder recovery devices 50, 50 are caused to move (slide) in the printing direction (Y-direction), two lifting and lowering devices 70, 70 lower recovery plate 60 so that recovery plate 60 is positioned in the same height position as that of mask MK0.

As shown in FIG. 1, front (left in FIG. 1) squeegee 34 of printer WM1 (on the left in the drawing in FIG. 1) moves solder SP0 from the front side to the rear side. As a result of relevant squeegee 34 moving in the advancing direction (the direction from the front side to the rear side of printer WM1), solder SP0 moves on mask MK0, whereby a printing process is executed. When the printing process ends, solder SP0 is moved to recovery plate 60 of rear (right in FIG. 2) solder recovery device 50, indicated by the dashed lines, of printer WM1 by squeegee 34.

Two solder recovery devices 50, 50 which are indicated by the dashed lines in FIGS. 1 and 2 are moved in the printing direction (Y-direction) by pair of corresponding driving devices 51, 51 to thereby be moved to the positions of two solder recovery devices 50, 50 which are indicated by the solid lines. Printer WM1 can execute the printing process on two boards CB0 which are conveyed in by two board conveyance devices 10 by repeating the series of operations described above.

1-2-2. Configuration Example of Solder Recovery Device 50

As shown in FIG. 3, solder recovery device 50 includes recovery plate 60, at least one (two in FIG. 2) lifting and lowering device 70, 70, and multiple (two in FIG. 3) connecting sections 100, 100 for one lifting and lowering device 70.

Recovery plate 60 recovers solder. Recovery plate 60 is formed into a plate-like shape in such a manner as to extend in the conveyance direction (X-direction) of board CB0 which is orthogonal to the printing direction (Y-direction). Recovery plate 60 includes an inclined portion 60a on a side to which solder SP0 is moved by squeegee 34 (on a side facing mask MK0). Inclined portion 60a is inclined at a predetermined angle with respect to a horizontal plane formed by the conveyance direction (X-direction) of board CB0 and the printing direction (Y-direction), whereby solder SP0 is moved to be placed on recovery plate 60 more easily than a case in which no inclined portion 60a is provided.

Lifting and lowering device 70 lifts up and lowers recovery plate 60. Lifting and lowering device 70 only need be able to lift up and lower recovery plate 60, and can take various forms. Lifting and lowering device 70 can move recovery plate 60 in the vertical direction (Z-direction) by, for example, a linear motion mechanism such as a cylinder. Specifically, as shown in FIG. 3, lifting and lowering device 70 includes main body section 71 and lifting and lowering section 72, which is lifted up and lowered relative to the main body section 71. Recovery plate 60 is detachably attached to lifting and lowering section 72 via multiple (two) connecting sections 100, 100.

Multiple (two) connecting sections 100, 100 each include fixing portion 80 and fixed portion 90, and when fixing portion 80 is fixed to fixed portion 90, recovery plate 60 is restrained from moving in a predetermined direction relative to lifting and lowering device 70. Fixing portion 80 is provided on recovery plate 60 so as to detachably attach recovery plate 60 to lifting and lowering device 70. Fixed portion 90 is provided on lifting and lowering device 70, so that fixing portion 80 is fixed thereto.

Here, as shown in FIG. 3, a moving direction of squeegee 34 in which squeegee 34 moves solder SP0 is referred to as a first direction (Y-direction). In addition, a direction in which recovery plate 60 is lifted up and lowered is referred to as a second direction (Z-direction). Further, a direction orthogonal to the first direction (Y direction) and the second direction (Z direction) is referred to as a third direction (X direction). In addition, fixing portion 80 that one connecting section 100 of multiple (two) connecting sections 100, 100 includes is referred to as first fixing portion 81, and fixed portion 90 to which first fixing portion 81 is fixed is referred to as first fixed portion 91. Further, fixing portion 80 that second connecting section 100 of multiple (two) connecting sections 100, 100 includes is referred to as second fixing portion 82, and fixed portion 90 to which second fixing portion 82 is fixed is referred to as second fixed portion 92.

In the present embodiment, connecting section 100 including first fixing portion 81 and first fixed portion 91 restrains recovery plate 60 from moving in the second direction (Z direction) and the third direction (X direction) relative to lifting and lowering device 70 when first fixing portion 81 is fixed to first fixed portion 91. In addition, connecting section 100 including second fixing portion 82 and second fixed portion 92 restrains recovery plate 60 from moving in the first direction (Y-direction) relative to lifting and lowering device 70 when second fixing portion 82 is fixed to second fixed portion 92. In this way, multiple (two) connecting sections 100, 100 have different restraining directions in which recovery plate 60 is restrained from moving relative to lifting and lowering device 70.

Figure 4:
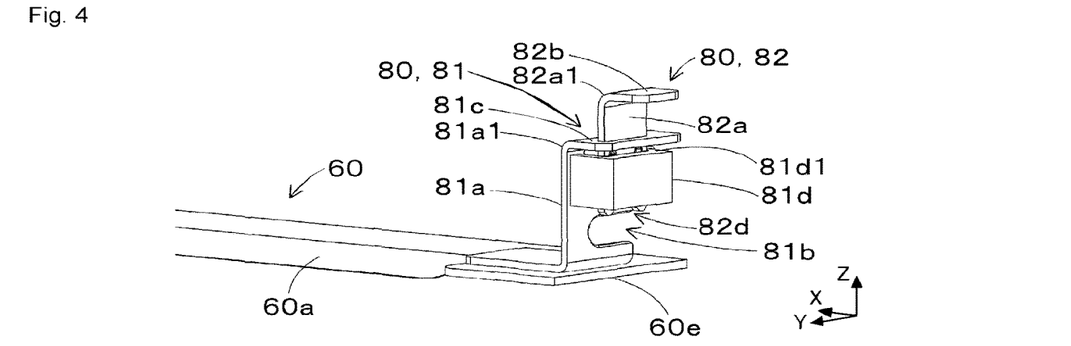
FIG. 4 illustrates a perspective view showing an example of a fixing portion when a restraining member of a second fixing portion is in an upper end position.
Figure 5:
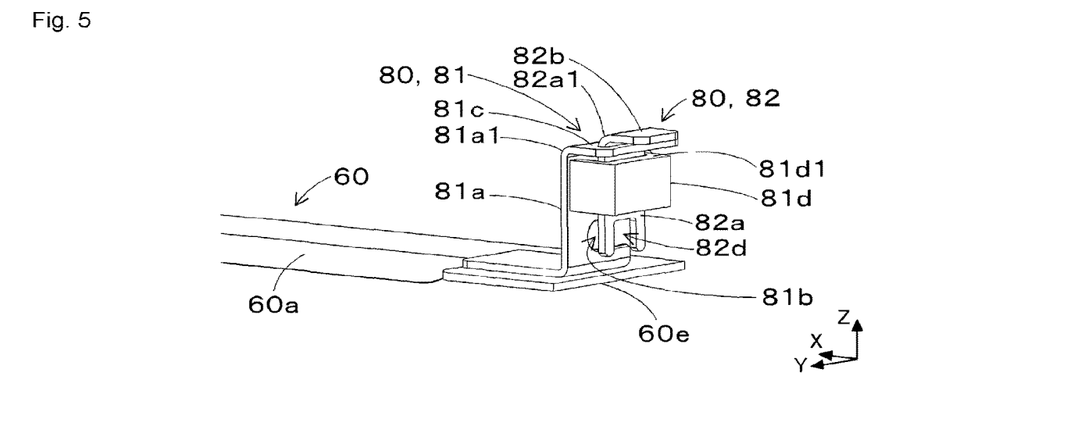
FIG. 5 illustrates a perspective view showing an example of the fixing portion when the restraining member of the second fixing portion is in a lower end position.

As shown in FIGS. 4 and 5, first fixing portion 81 includes rising edge portion 81a, groove section 81b, protruding portion 81c, and supporting portion 81d. Rising edge portion 81a extends upwards from recovery plate 60 in the second direction (Z-direction). Groove section 81b is formed into a U-shape and is formed in such a manner as to extend along the first direction (Y-direction) in rising edge portion 81a. Protruding portion 81c protrudes outwards of recovery plate 60 from distal end portion 81a1 of rising edge portion 81a. Supporting portion 81d supports second fixing portion 82.

Second fixing portion 82 is formed into an L-shape. Second fixing portion 82 includes extending portion 82a and gripping portion 82b. Extending portion 82a extends along the second direction (Z-direction). Gripping portion 82b protrudes outwards of recovery plate 60 from upper end portion 82a1 of extending portion 82a, so that the operator can grip thereon. Second fixing portion 82 is provided so as to move in the second direction (Z direction) by penetrating protruding portion 81c and supporting portion 81d.

For example, the operator can grip on gripping portion 82b to thereby move second fixing portion 82 in the second direction (Z-direction). FIG. 4 shows a state of second fixing portion 82 before second fixing portion 82 is fixed to second fixed portion 92 (when restraining member 82c of second fixing portion 82, which will be described later, stays in upper end position U0). FIG. 5 shows a state of second fixing portion 82 when second fixing portion 82 is fixed to second fixed portion 92 (when restraining member 82c of second fixing portion 82, which will be described later, stays in lower end position L0).

Figure 6:
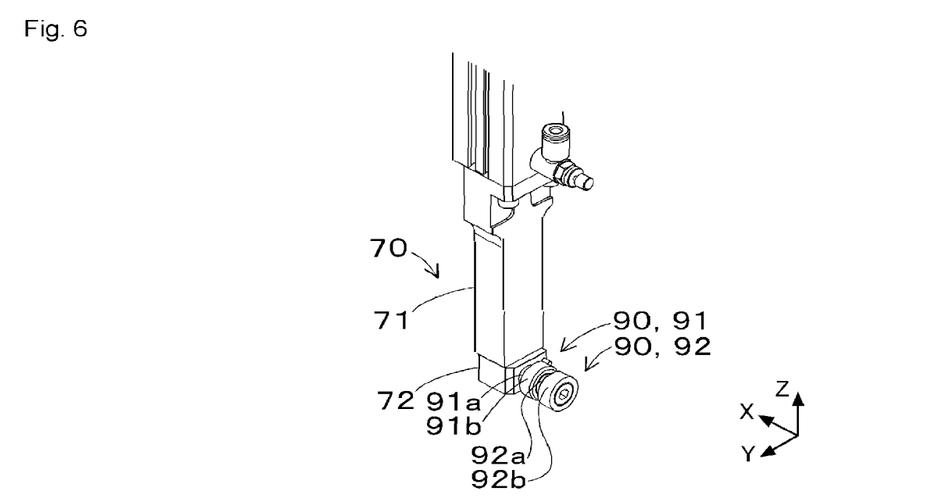
FIG. 6 illustrates a perspective view showing an example of a fixed portion.

As shown in FIG. 6, first fixed portion 91 and second fixed portion 92 are provided on lifting and lowering section 72. First fixed portion 91 includes first shaft section 91a and first flange portion 91b. First shaft section 91a extends from lifting and lowering section 72 along the third direction (X-direction). First flange portion 91b is provided at an end portion of first shaft section 91a which is opposite to an end portion facing lifting and lowering section 72. Groove section 81b of first fixing portion 81 is fitted on first shaft section 91a.

Figure 7:
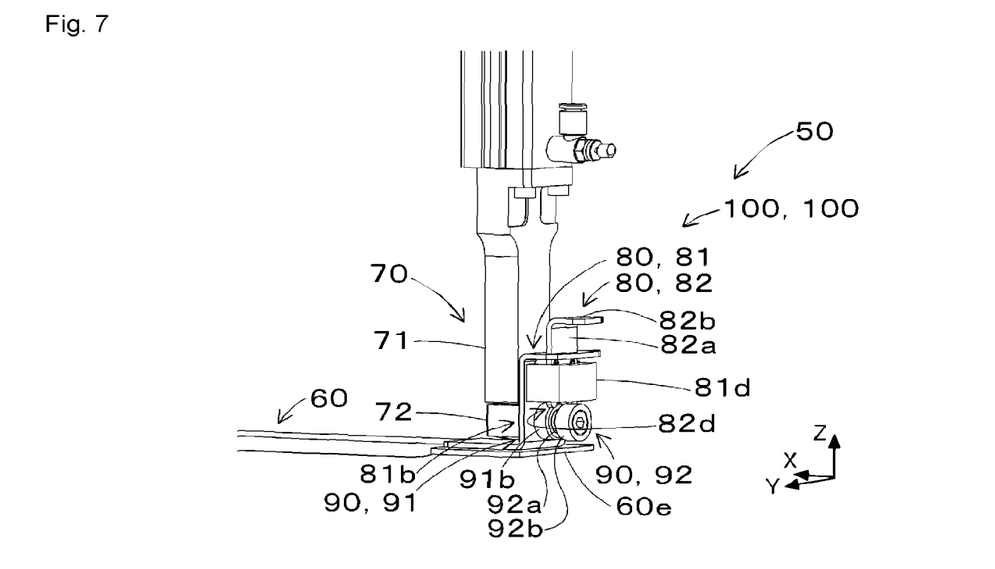
FIG. 7 illustrates a perspective view showing an example of connecting sections when a groove section of a first fixing portion fits on a first shaft section of a first fixed portion.

For example, the operator can grip on gripping portions 82b, which are in the state shown in FIG. 4, provided individually at both end portions 60e, 60e of recovery plate 60, so that groove section 81b of first fixing portion 81 is fitted on first shaft section 91a of first fixed portion 91. FIG. 7 shows an example of connecting section 100 when groove section 81b of first fixing portion 81 is fitted on first shaft section 91a of first fixed portion 91. In the present embodiment, since first fixed portion 91 includes first flange portion 91b, groove section 81b is guided on to first shaft section 91a by first flange portion 91b, thereby facilitating the operation of the operator.

In addition, groove section 81b is formed into the U-shape, and hence, groove section 81b restrains recovery plate 60 from moving in the second direction (Z-direction) while allowing recovery plate 60 to move in the first direction (Y-direction). Specifically, as shown in FIG. 4, groove section 81b is formed in such a manner as to extend along the first direction (Y-direction), whereby recovery plate 60 is allowed to move in the first direction (Y-direction). In addition, a groove width (a length in the Z direction) of groove section 81b is formed so as to fit on first shaft section 91a, whereby recovery plate 60 is restrained from moving in the second direction (the Z direction) when groove section 81b fits on first shaft section 91a.

Further, when groove section 81b fits on first shaft section 91a, recovery plate 60 is restrained from moving in the third direction (the X-direction) by lifting and lowering section 72 and first flange portion 91b. In this way, with solder recovery device 50 of the present embodiment, recovery plate 60 is restrained from moving in the second direction (Z direction) and the third direction (X direction) as a result of groove section 81b of first fixing portion 81 fitting on first fixed portion 91 (first shaft section 91a in the present embodiment).

As shown in FIG. 6, second fixed portion 92 includes second shaft section 92a and second flange portion 92b. Second shaft section 92a extends from first flange portion 91b of first fixed portion 91 along the third direction (X-direction) coaxially with first shaft section 91a. Second flange portion 92b is provided at an end portion of second shaft section 92a which is located opposite to an end portion facing first flange portion 91b. As shown in FIGS. 4 and 5, second fixing portion 82 includes fitting portion 82d that fits on second shaft section 92a.

For example, after having fitted groove section 81b of first fixing portion 81 on first shaft section 91a of first fixed portion 91, the operator moves gripping portion 82b downwards in the second direction (Z direction), causing second fixing portion 82 to move downwards in the second direction (Z direction). As a result, second fixing portion 82 is shifted from the state shown in FIG. 4 to the state shown in FIG. 5. In this manner, the operator can fit fitting portion 82d of second fixing portion 82 on second shaft section 92a of second fixed portion 92 using gripping portion 82b.

Figure 8:
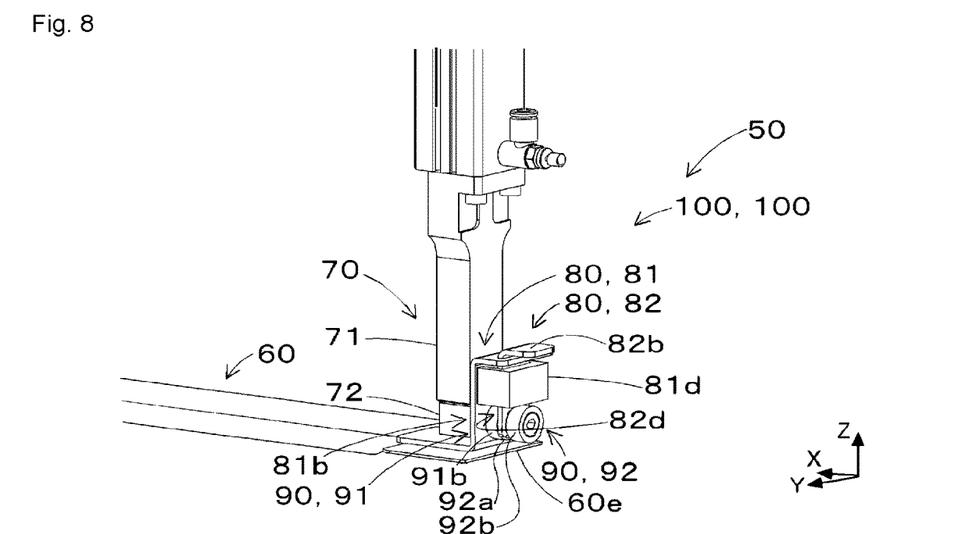
FIG. 8 illustrates a perspective view showing an example of the connecting sections when a fitting portion of the second fixing portion fits on a second shaft section of a second fixed portion.

FIG. 8 shows an example of connecting section 100 when fitting portion 82d of second fixing portion 82 is fitted on second shaft section 92a of second fixed portion 92. In the present embodiment, since first fixed portion 91 includes first flange portion 91b, and second fixed portion 92 includes second flange portion 92b, fitting portion 82d of second fixing portion 82 is guided on to second shaft section 92a by first flange portion 91b and second flange portion 92b, thereby facilitating the operation by the operator. In addition, since second fixing portion 82 includes gripping portion 82b, the operator can work by gripping on gripping portion 82b, thereby facilitating the operation by the operator.

In this way, second fixing portion 82 fits on second fixed portion 92 (second shaft section 92a in the present embodiment) via first fixing portion 81, whereby recovery plate 60 is restrained further from moving in the first direction (Y direction). That is, with first fixing portion 81 of the present embodiment, when first fixing portion 81 is fixed to first fixed portion 91, recovery plate 60 is restrained from moving in the second direction (Z-direction) and the third direction (X-direction) in the first direction (Y-direction), the second direction (Z-direction) and the third direction (X-direction) relative to lifting and lowering device 70. In addition, with second fixing portion 82, when second fixing portion 82 is fixed to second fixed portion 92, recovery plate 60 is restrained from moving in the remaining direction (the first direction (Y-direction)) in the first direction (Y-direction), the second direction (Z-direction) and the third direction (X-direction) relative to lifting and lowering device 70.

Figure 9:
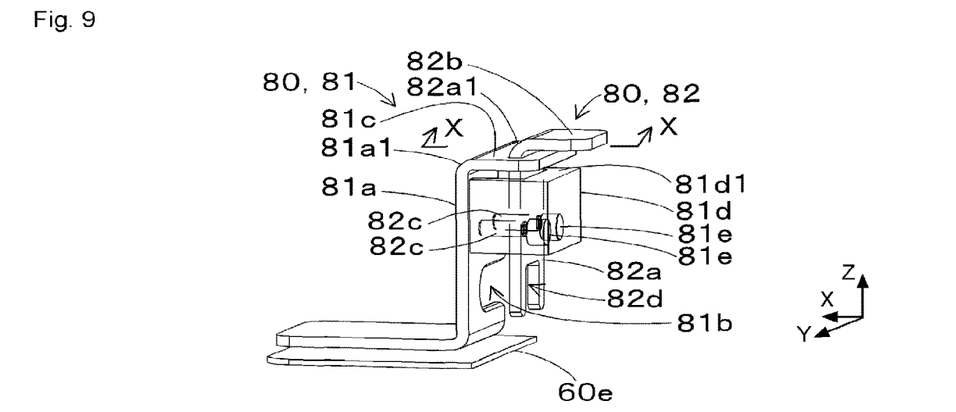
FIG. 9 illustrates a perspective view showing an inside configuration of a supporting portion of the first fixing portion.
Figure 10:
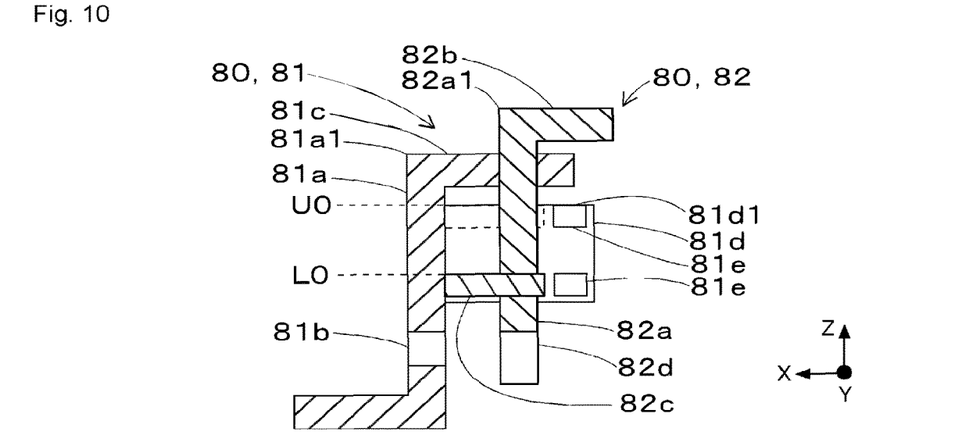
FIG. 10 illustrates a sectional view showing a positional relationship between a holding member of the first fixing portion and the restraining member of the second fixing portion.

As shown in FIGS. 9 and 10, second fixing portion 82 can include a restraining member 82c. Restraining member 82c moves in an inside portion of supporting portion 81d as second fixing portion 82 moves in the second direction (Z-direction). Second fixing portion 82 is restrained from moving upwards in the second direction (Z-direction) as a result of restraining member 82c arriving at a top portion 81d1 of supporting portion 81d. As a result, the detachment of second fixing portion 82 is suppressed.

In addition, supporting portion 81d can include holding member 81e. Holding member 81e is provided at least at lower end position L0 of lower end position L0 and upper end position U0, and holds a facing state with restraining member 82c. Lower end position L0 means a position which faces restraining member 82c when second fixing portion 82 fits on second fixed portion 92. Upper end position U0 means a position which faces restraining member 82c when restraining member 82c arrives at top portion 81d1 of supporting portion 81d.

As a result, fitting portion 82d of second fixing portion 82 can be prevented from moving away from second shaft section 92a of second fixed portion 92 as a result of second fixing portion 82 moving upwards in the second direction (Z-direction), for example, when recovery plate 60 is lifted up. In addition, second fixing portion 82 is positioned easily in the second direction (Z-direction) is facilitated. Further, in the case that holding member 81e is provided in upper end position U0, since holding member 81e can be held in upper end position U0, the operator can easily execute the fitting operation of fitting groove section 81b of first fixing portion 81 on first shaft section 91a of first fixed portion 91 by gripping on gripping portion 82b.

Holding member 81e only need be able to hold the facing state with restraining member 82c and can take various forms. For example, holding member 81e only need be formed of a magnetic material, and restraining member 82c only need be formed of a metallic material. For example, a known permanent magnet such as a ferrite magnet, a rare earth magnet, or the like can be used for holding member 81e. For example, an iron cylindrical member can be used for restraining member 82c. Extending portion 82a can be formed of a non-metallic material such as stainless steel, for example.

In this mode, restraining member 82c of second fixing portion 82 is held in lower end position L0 or upper end position U0 by virtue of magnetic force. To make this happen, as shown in FIG. 10, a gap can be provided between holding member 81e and restraining member 82c. As a result, facing surfaces of holding member 81e and restraining member 82c are prevented from being deteriorated (for example, worn) when compared with a form in which restraining member 82c is held as a result of holding member 81e being brought into contact with restraining member 82c.

In addition, in the present embodiment, multiple (two) connecting sections 100, 100 are provided individually at both the end portions 60e, 60e of recovery plate 60, and lifting and lowering device 70 is provided individually at both the end portions 60e, 60e of recovery plate 60, as shown in FIG. 3. As a result, when compared with a form in which multiple (two) connecting sections 100, 100 and lifting and lowering device 70 are provided at only one end portion of recovery plate 60, with solder recovery device 50 of the present embodiment, the orientation of recovery plate 60 is easily stabilized when recovery plate 60 is lifted up or lowered.

2. Modified Aspect

In the embodiment described above, when first fixing portion 81 is fixed to first fixed portion 91, recovery plate 60 is restrained from moving in the second direction (Z direction) and the third direction (X direction) in the first direction (Y direction), the second direction (Z direction), and the third direction (X direction) relative to lifting and lowering device 70. In addition, with second fixing portion 82, when second fixing portion 82 is fixed to second fixed portion 92, recovery plate 60 is restrained from moving in the remaining direction (the first direction (Y-direction)) in the first direction (Y-direction), the second direction (Z-direction) and the third direction (X-direction) relative to lifting and lowering device 70.

However, multiple (two) connecting sections 100, 100 are not limited to those described in the embodiment described above. For example, first fixing portion 81 may be such that when first fixing portion 81 is fixed to first fixed portion 91, first fixing portion 81 restrains recovery plate 60 from moving in the first direction (Y-direction) and the third direction (X-direction) in the first direction (Y-direction), the second direction (Z-direction), and the third direction (X-direction) relative to lifting and lowering device 70. In this case, when second fixing portion 82 is fixed to second fixed portion 92, second fixing portion 82 restrains recovery plate 60 from moving in the remaining direction (the second direction (Z-direction)) in the first direction (Y-direction), the second direction (Z-direction), and the third direction (X-direction) relative to lifting and lowering device 70.

Similarly, first fixing portion 81 may be such that when first fixing portion 81 is fixed to first fixed portion 91, first fixing portion 81 restrains recovery plate 60 from moving in the first direction (Y-direction) and the second direction (Z-direction) in the first direction (Y-direction), the second direction (Z-direction), and the third direction (X-direction) relative to lifting and lowering device 70. In this case, when second fixing portion 82 is fixed to second fixed portion 92, second fixing portion 82 restrains recovery plate 60 from moving in the remaining direction (the third direction (X-direction)) in the first direction (Y-direction), the second direction (Z-direction), and the third direction (X-direction) relative to lifting and lowering device 70.

In addition, first fixing portion 81 may be such that when first fixing portion 81 is fixed to first fixed portion 91, first fixing portion 81 restrains recovery plate 60 from moving in any one direction in the first direction (Y-direction), the second direction (Z-direction), and the third direction (X-direction) relative to lifting and lowering device 70. In this case, when second fixing portion 82 is fixed to second fixed portion 92, second fixing portion 82 restrains recovery plate 60 from moving in the remaining two directions in the first direction (Y-direction), the second direction (Z-direction), and the third direction (X-direction) relative to lifting and lowering device 70.

In this way, when first fixing portion 81 is fixed to first fixed portion 91, first fixing portion 81 restrains recovery plate 60 from moving in at least one direction in the first direction (Y-direction), the second direction (Z-direction), and the third direction (X-direction) relative to lifting and lowering device 70. In addition, when second fixing portion 82 is fixed to second fixed portion 92, second fixing portion 82 restrains recovery plate 60 from moving in the remaining direction or directions in the first direction (Y-direction), the second direction (Z-direction), and the third direction (X-direction) relative to lifting and lowering device 70.

In addition, the number of connecting sections 100 to be provided for one lifting and lowering device 70 is not limited to two. For example, three connecting sections 100 can be provided for one lifting and lowering device 70. In this case, for example, when fixing portion 80 possessed by first connecting section 100 is fixed to one fixed portion 90, fixing portion 80 restrains recovery plate 60 from moving in one direction in the first direction (Y-direction), the second direction (Z-direction), and the third direction (X-direction) relative to lifting and lowering device 70.

In addition, when fixing portion 80 possessed by second or remaining connecting section 100 is fixed to one fixed portion 90, fixing portion 80 restrains recovery plate 60 from moving in one direction of the remaining two directions in the first direction (Y direction), the second direction (Z direction), and the third direction (X direction) relative to lifting and lowering device 70. Further, when fixing portion 80 possessed by second or remaining connecting section 100 is fixed to one fixed portion 90, fixing portion 80 restrains recovery plate 60 from moving in the remaining one direction in the first direction (Y-direction), the second direction (Z-direction), and the third direction (X-direction) relative to lifting and lowering device 70.

The restraining direction in which recovery plate 60 is restrained from moving relative to lifting and lowering device 70 is not limited to the first direction (Y-direction), the second direction (Z-direction), and the third direction (X-direction). For example, a Cartesian coordinate system (a second coordinate system) which results from rotating a Cartesian coordinate system (first coordinate system) including the first direction (Y-direction), the second direction (Z-direction), and the third direction (X-direction) about an origin may be assumed to constitute the restraining direction. In addition, both the first coordinate system and the second coordinate system may be assumed to constitute the restraining direction.

3. Example of Advantageous Effects of Embodiment

Solder recovery device 50 includes multiple connecting sections 100 having the different restraining directions in which recovery plate 60 is restrained from moving relative to lifting and lowering device 70 when fixing portion 80 is fixed to fixed portion 90. As a result, with this solder recovery device 50, even if the restraint of recovery plate 60 in the one or first direction is released, recovery plate 60 still can be restrained from moving in the other or second direction relative to lifting and lowering device 70. That is, solder recovery device 50 of the present embodiment can strengthen the fixing of recovery plate 60 to lifting and lowering device 70 more than a solder recovery device having one connecting section 100 having one restraining direction.

REFERENCE SIGNS LIST

34: squeegee, 50: solder recovery device, 60: recovery plate, 60e, 60e: both end portions, 70: lifting and lowering device, 71: main body section, 72: lifting and lowering section, 80: fixing portion, 81: first fixing portion, 81a: rising edge portion, 81a1: distal end portion, 81b: groove section, 81c: protruding portion, 81d: supporting portion, 81d1: top portion, 81e: holding member, 82: second fixing portion, 82a: extending portion, 82a1: upper end portion, 82b: gripping portion, 82c: restraining member; 82d: fitting portion; 90: fixed portion, 91: first fixed portion, 91a: first shaft section; 91b: first flange portion, 92: second fixed portion, 92a: second shaft section; 92b: second flange portion; 100: connecting section; U0: upper end position; L0: lower end position; Y-direction: first direction; Z-direction: second direction; X-direction: third direction

The invention claimed is:

1. A solder recovery device comprising:
a recovery plate configured to recover solder;
a lifting and lowering device configured to lift up and lower the recovery plate; and
multiple connecting sections comprising, in turn, a fixing portion provided on the recovery plate and configured to detachably attach the recovery plate to the lifting and lowering device and a fixed portion provided on the lifting and lowering device and to which the fixing portion is fixed, the fixing portion including a first fixing portion and a second fixing portion, the multiple connecting sections being configured to restrain the recovery plate from moving in a predetermined direction relative to the lifting and lowering device when the fixing portion is fixed to the fixed portion,
wherein a moving direction of a squeegee in which the squeegee moves the solder is referred to as a first direction, a lifting and lowering direction in which the recovery plate is lifted up and lowered is referred to as a second direction, and a direction which is orthogonal to the first direction and the second direction is referred to as a third direction,
wherein the second fixing portion restrains the recovery plate in the first direction relative to the lifting and lowering device and the second fixing portion is movable in the second direction relative to the first fixing portion, and
wherein the first fixing portion includes a groove section which restrains the recovery plate in the second direction and the third direction relative to the lifting and lowering device.

2. The solder recovery device according to claim 1, wherein the fixed portion comprises a first fixed portion and a second fixed portion,
wherein the first fixing portion is fixed to the first fixed portion, and
wherein the second fixing portion is fixed to the second fixed portion.

3. The solder recovery device according to claim 2, wherein the groove section is formed into a U-shape which restrains the recovery plate from moving in the second direction while allowing the recovery plate to move in the first direction, and
wherein the groove section is configured to fit on the first fixed portion to thereby restrain the recovery plate from moving in the second direction and the third direction.

4. The solder recovery device according to claim 3, wherein the lifting and lowering device comprises:
a main body section; and
a lifting and lowering section configured to be lifted up and lowered relative to the main body section, wherein the first fixed portion and the second fixed portion are provided on the lifting and lowering section, wherein the first fixed portion comprises:

a first shaft section extending from the lifting and lowering section along the third direction; and a first flange portion provided at an end portion of the first shaft section which lies opposite to an end portion thereof which faces the lifting and lowering section, and wherein the groove section in the first fixing portion fits on the first shaft section.

5. The solder recovery device according to claim 4, wherein the second fixed portion comprises:

a second shaft section extending from the first flange portion of the first fixed portion coaxially with the first shaft section along the third direction; and a second flange portion provided at an end portion of the second shaft section which lies opposite to an end portion thereof which faces the first flange portion, and wherein the second fixing portion comprises a fitting portion configured to fit on the second shaft section.

6. The solder recovery device according to claim 3, wherein the second fixing portion fits on the second fixed portion via the first fixing portion to restrain further the recovery plate from moving in the first direction.

7. The solder recovery device according to claim 6, wherein the second fixing portion is formed in an L-shape, and comprises:

an extending portion extending along the second direction; and a gripping portion protruding outwards of the recovery plate from an upper end portion of the extending portion in such a manner that an operator can grip thereon.

8. The solder recovery device according to claim 6, wherein the first fixing portion comprises:

a rising edge portion extending upwards in the second direction from the recovery plate;

a protruding portion protruding outwards of the recovery plate from a distal end portion of the rising edge portion; and a supporting portion configured to support the second fixing portion, wherein the groove section is formed in such a manner as to extend along the first direction in the rising edge portion, and wherein the second fixing portion is provided in such a manner as to penetrate the protruding portion and the supporting portion to move in the second direction.

9. The solder recovery device according to claim 8, wherein the second fixing portion comprises a restraining member configured to move in an inside portion of the supporting portion in association with a movement of the second fixing portion in the second direction, and wherein the second fixing portion is restrained from moving upwards in the second direction as a result of the restraining member arriving at a top portion of the supporting portion.

10. The solder recovery device according to claim 9, wherein the supporting portion comprises a holding member provided in, of a lower end position where the holding member faces the restraining member when the second fixing portion fits on the second fixed portion of the lower end position and an upper end position where the holding member faces the restraining member when the restraining member arrives at the top portion of the supporting portion, at least the lower end position so as to hold a facing state with the restraining member.

11. The solder recovery device according to claim 10, wherein the holding member is formed of a magnetic material, and wherein the restraining member is formed of a metallic material.

12. The solder recovery device according to claim 1, wherein the multiple connecting sections are provided at each of both end portions of the recovery plate, and wherein the lifting and lowering device is provided at each of both the end portions of the recovery plate.

* * * * *